(12) United States Patent
Bartzsch et al.

(10) Patent No.: US 10,407,767 B2
(45) Date of Patent: Sep. 10, 2019

(54) METHOD FOR DEPOSITING A LAYER USING A MAGNETRON SPUTTERING DEVICE

(71) Applicant: Fraunhofer-Gesellschaft zur Förderung der angewandten Forschung e.V., Munich (DE)

(72) Inventors: Hagen Bartzsch, Dresden (DE); Peter Frach, Radeberg (DE); Jan Hildisch, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 79 days.

(21) Appl. No.: 15/696,924

(22) Filed: Sep. 6, 2017

(65) Prior Publication Data

US 2018/0066356 A1 Mar. 8, 2018

(30) Foreign Application Priority Data

Sep. 7, 2016 (DE) .......... 10 2016 116 762

(51) Int. Cl.
*C23C 14/35* (2006.01)
*C23C 14/34* (2006.01)
(Continued)

(52) U.S. Cl.
CPC ...... *C23C 14/3485* (2013.01); *C23C 14/0094* (2013.01); *C23C 14/10* (2013.01);
(Continued)

(58) Field of Classification Search
CPC ... C23C 14/0094; C23C 14/10; C23C 14/345; C23C 14/3485; C23C 14/352;
(Continued)

(56) References Cited

U.S. PATENT DOCUMENTS

| 5,015,493 A | 5/1991 | Gruen |
| 6,005,218 A | 12/1999 | Walde et al. |

(Continued)

FOREIGN PATENT DOCUMENTS

| DE | 252 205 A1 | 12/1987 |
| DE | 3802852 A1 | 8/1989 |

(Continued)

OTHER PUBLICATIONS

JP 2012-084526 dated Apr. 2012. (Year: 2012).*

*Primary Examiner* — Rodney G McDonald
(74) *Attorney, Agent, or Firm* — Brinks Gilson & Lione

(57) ABSTRACT

A method is provided for depositing a layer on a substrate inside a vacuum chamber by a magnetron sputtering device comprising at least two magnetron cathodes, each equipped with one target, at least one additional electrode, wherein a separate power supply unit is allocated to each magnetron cathode and wherein, in addition to at least one working gas, at least one reactive gas is introduced into the vacuum chamber. In a first phase, a pulsed negative direct current voltage is conducted from each power supply unit to the corresponding magnetron cathode, wherein the power supply units are operated in the push-pull mode. In a second phase, the pulsed direct current voltages provided by the power supply units are switched between the corresponding magnetron cathode and the additional electrode. An electric voltage is applied to the substrate or an electrode at the back of the substrate.

10 Claims, 2 Drawing Sheets

(51) Int. Cl.
*C23C 14/10* (2006.01)
*C23C 14/00* (2006.01)
*H01J 37/34* (2006.01)

(52) U.S. Cl.
CPC .......... *C23C 14/345* (2013.01); *C23C 14/352* (2013.01); *H01J 37/3467* (2013.01)

(58) Field of Classification Search
CPC ............... H01J 37/3408; H01J 37/3417; H01J 37/3444; H01J 37/3467
USPC .................................................... 204/298.08
See application file for complete search history.

(56) References Cited

U.S. PATENT DOCUMENTS

| | | |
|---|---|---|
| 6,096,174 A | 8/2000 | Teschner |
| 6,340,416 B1 | 1/2002 | Goedicke et al. |
| 7,404,877 B2 * | 7/2008 | Demaray ............ C23C 14/3414 204/192.15 |
| 2015/0152542 A1 * | 6/2015 | Deppisch ............ C23C 14/0042 204/192.12 |
| 2016/0369390 A1 | 12/2016 | Bartzsch |

FOREIGN PATENT DOCUMENTS

| | | |
|---|---|---|
| DE | 44 38 463 C1 | 2/1996 |
| DE | 37 00 633 C2 | 2/1997 |
| DE | 196 51 811 A1 | 6/1998 |
| DE | 197 02 187 A1 | 7/1998 |
| DE | 198 30 304 A1 | 1/2000 |
| DE | 10 2010 047 963 A1 | 4/2012 |
| DE | 10 2013 213 935 A1 | 1/2015 |
| JP | 2012-084526 * | 4/2012 |
| WO | WO 2009/040406 A2 | 4/2009 |

* cited by examiner

METHOD FOR DEPOSITING A LAYER USING A MAGNETRON SPUTTERING DEVICE

CROSS-REFERENCE TO RELATED APPLICATIONS

This application claims priority under 35 USC § 119 to German Patent Application No. 10 2016 116 762.2, filed Sep. 7, 2016.

DETAILED DESCRIPTION

Figure 1:
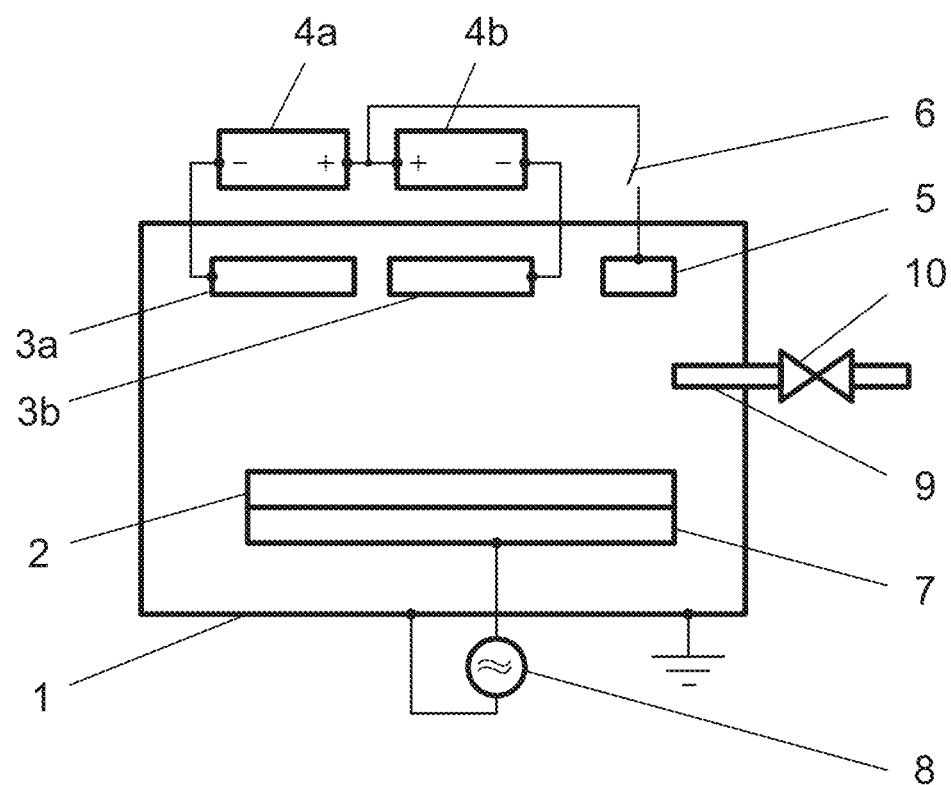
FIG. 1 shows an apparatus that is suitable for implementing the method according to the invention.

The invention relates to a method for operating a magnetron sputtering device, in which electric energy is supplied in a pulsed form. Here, the magnetron sputtering device can be used both as a source of particles for layer deposition via magnetron sputtering, in other words, a process of physical vapor deposition (PVD), and as a plasma source in a process of plasma-enhanced chemical vapor deposition (PECVD).

Particularly in the deposition of electrically insulating layers by means of reactive magnetron sputtering of a metal target in a mixture comprising inert gas and reactive gas, the supplying of pulsed energy in the frequency range from 10 to 350 kHz has generally gained acceptance. The reason for that is an improved process stability with a pulsed energy supply compared to a DC energy supply. During the pulse pauses of the pulsed process, charge carriers from the plasma can recombine with charge carriers that have accumulated on insulating layers. As a result, the formation of arc discharges detrimental to the coating process can be prevented. A lastingly stable coating process is thus ensured by the pulsed energy supply. Furthermore, magnetron sources supplied with pulsed energy are used also as plasma sources for the plasma-enhanced chemical vapor deposition with similar advantages with regards to stability.

Two main forms of the pulsed energy supply, which are different in principle, have been established for magnetron sputtering; they are also referred to as unipolar and bipolar pulse-modes. In the unipolar pulse mode, a pulsed direct current is applied between the target of a magnetron sputtering source and a separate electrode, the substrate or the recipient mass. DE 37 00 633 C2 describes such a variant of the energy supply for PVD processes in general. The target acts as the cathode of the gas discharge, and the recipient mass, the substrate, or the separate electrode acts as the anode.

In the bipolar pulse mode, an electric voltage with alternating polarity is applied between two targets of a double magnetron arrangement, which are electrically insulated from each other. Here, said targets act alternately as the anode and the cathode of the gas discharge embodied as a magnetron discharge. A separate electrode is therefore not required for the anode. DD 252 205 A1 and DE 38 02 852 A1 describe the general principle of this bipolar energy supply. DE 44 38 463 C1 specifies a frequently used embodiment for the bipolar pulse supply.

Further, special forms of the pulsed energy supply are known, which have features of both the unipolar and the bipolar operation. WO 2009/040406 A2, for example, describes the so-called redundant anode sputtering. In addition to the target lying at cathode potential, two electrodes are operated alternately as the anode and the cathode, wherein, in this phase, the respective electrode lying at cathode potential is sputtered freely and thus represents a lastingly effective anode in the anode phase.

During energy input in the so-called pulse package mode (DE 197 02 187 A1), packages of unipolar pulses are applied between two targets of a double magnetron arrangement. A polarity change respectively occurs between two successive packages.

Experience shows that there are considerable differences between the unipolar and the bipolar pulse modes with regard to plasma density immediately in front of a substrate to be coated and the resulting bombardment of the growing layer with energy-rich particles. The unipolar pulse mode shows low plasma density, as experience has taught, and provides a gentler substrate bombardment, as is desired for example when temperature-sensitive substrates are coated. In the bipolar pulse mode, on the other hand, very strong substrate bombardment is given, which can advantageously be used for generating very dense layers. The differences in the plasma density in front of the surface of a substrate to be coated can hereby be as much as a factor of 10 with the same sputtering device, assuming it is suitable for both pulse modes. The physical reason for these striking differences is the use of a magnetron target as the anode in the bipolar operation. The magnetic field applied there displaces energy-rich electrons from areas near the target into areas near the substrate and leads to the high plasma density in front of the substrate.

The possibility to operate an arrangement of at least two magnetron sputtering sources optionally in the unipolar or the bipolar pulse mode, allows an appropriate plasma density for many applications to be set in front of the substrate by selecting the pulse mode. However, if a finer dosing of the plasma density is required between the two pulse modes, this option is no longer sufficient.

DE 196 51 811 A1 describes a device for a bipolar energy supply, in which by means of an additional adjustable, pulsed voltage, more ions can be accelerated towards the substrate. A disadvantage of this arrangement is that the intensity of the substrate bombardment can only be increased beyond the already high level of the bipolar mode.

DE 10 2010 047 963 A1 discloses a magnetron sputtering device comprising two targets and being operated in the bipolar mode, in which an additional electrode is switched temporarily and repeatedly as an anode of a magnetron discharge between the additional electrode and the target respectively functioning as the cathode. With such a procedure, it is possible to adjust the plasma density and thus the degree of ionization in the proximity of a substrate surface to be coated. Here it is disadvantageous that the energy, with which the ions impinge upon the substrate surface, cannot be adjusted. Uneven conditions with regard to the substrate surface cannot be corrected by the deposited layer in such a deposition method, but instead continue in the deposited layer.

The invention is therefore based on the technical problem to provide a method for depositing a layer by means of a magnetron sputtering device, by means of which the disadvantages of the prior art can be overcome. In particular, the method according to the invention should also allow the deposition of a layer on a substrate, which smooths unevennesses of the substrate surface. Further, the method according to the invention should have a high deposition rate.

The method according to the invention for depositing a layer on a substrate is performed within a vacuum chamber using a magnetron sputtering device comprising at least two magnetron cathodes, each equipped with one target, and at least one additional electrode, wherein a separate power supply unit for generating a pulsed, negative direct current voltage is allocated to each magnetron cathode. The pulsed direct current voltage is generated with a pulse frequency of 20 kHz to 350 kHz. In addition to at least one working gas, at least one reactive gas is also introduced into the vacuum chamber. An oxygen-containing gas, a mixture of oxygen and a nitrogen-containing gas, or a mixture of oxygen and a gas containing a fluorine compound, for example, can be introduced into the vacuum chamber as the reactive gas.

In the method according to the invention, the power supply units allocated to the magnetron cathodes are operated in two different phases. In a first phase a pulsed, negative direct current voltage is conducted from each power supply unit to the corresponding magnetron cathode, wherein the power supply units are operated in the push-pull mode. Operation in the push-pull mode means that in each case at least one power supply unit generates a voltage pulse, while at least one other power supply unit generates a pulse pause. In the period of the pulse pause, at least one of these other power supply units is electrically conductively switched to through-flow, so that the positive voltage pole of the at least one power supply unit, which generates a voltage pulse, is electrically conductively connected to at least the magnetron cathode, which is allocated to the at least one power supply unit that is electrically conductively switched to through-flow. Electrically conductively switching a power supply unit to through-flow can alternatively also be realized by electrically conductively bridging this power supply unit by means of an appropriate external circuit.

In a second phase, the pulsed direct current voltages provided by the power supply units are respectively switched between the magnetron cathode allocated to a power supply unit and the additional electrode, allowing the power supply units to be operated in the common mode, the push-pull mode, or overlapping with regard to the pulse sections. In the method according to the invention, a switch between the first phase and the second phase is made at a frequency in the range from 1 Hz to 10 kHz. The first phases are characterized by a higher plasma density with respect to the second phases, allowing a mean plasma density, and thus a mean current density of the ion current onto the substrate, to be set via the ratio of the time component of the first phases to the second phases.

Another feature of the method according to the invention is that an electric voltage with a frequency higher than 1 MHz is applied to the substrate to be coated. If the substrate consists of a material that is not electrically conductive, for example, this high-frequency voltage can also be applied to a substrate electrode that is arranged on the back side of the substrate, which is not to be coated. By applying a high-frequency voltage to the substrate or to a substrate electrode, a bias voltage forms at the substrate and/or the substrate electrode in relation to the plasma potential, by means of which the energy with which ions impinge from the plasma onto the surface of the substrate to be coated can be adjusted.

The higher the bias voltage, the higher the energy with which the ions impinge on the surface of the substrate to be coated.

The method according to the invention is further characterized in that the introduction of the reactive gas into the vacuum chamber is controlled such that the sputtering of the targets arranged on the magnetron cathodes occurs in the transition mode. Process steps for sputtering a target in the transition mode, thus a mode between the metallic mode and the reactive mode, and for the respective control of the supply of the reactive gas are known and are characterized by a high deposition rate. When sputtering in the transition mode, a reactive gas is introduced into the vacuum chamber such that the target surfaces are covered only partially with reactive products, so that during the sputtering process both metallic target components and reactive products are dusted off the target surface.

Surprisingly, it has been shown that a combination of the features, as they are combined in the method according to the invention, not only leads to a layer deposition with a high deposition rate, but also that unevenness of a substrate surface to be coated can be smoothed out with a layer deposition according to the invention. The method according to the invention is therefore particularly suited for the deposition of smoothing layers.

Due to the formation of the bias voltage at the substrate or the substrate cathode, the acceleration of ions from the plasma to the substrate surface to be coated is associated with a sputter removal on the substrate surface to be coated. Using the mean plasma density, which is a function of the time component of the first and the second phase, and the magnitude of the bias voltage, the sputter removal at the substrate surface can be adjusted.

An advantage of this method according to the invention is that, in contrast to the prior art, energy and current density of the ions causing a sputter removal of the substrate surface can be adjusted independently of one other. To avoid too much sputter removal at the substrate to be coated, and with it a too extreme reduction of the layer growth, it is beneficial to adjust the time components of the first phases, which are characterized by a high plasma density, to an overall proportion of 5% to 60% and preferably to a proportion of 10% to 35%, and to use electric power, which amounts to 5% to 50% and preferably 10% to 35% of the electric power for sputtering all targets, for generating the high-frequency voltage at the substrate and/or the substrate electrode.

In the following the present invention is explained in greater detail based on an exemplary embodiment. In a schematic illustration, FIG. 1 shows an apparatus that is suitable for implementing the method according to the invention. A silicon oxide layer is to be deposited on a plate-shaped substrate 2 inside a vacuum chamber 1. In the method according to the invention, the pressure in the vacuum chamber is set to a value of less than 0.5 Pa. Further, a magnetron cathode 3a, a magnetron cathode 3b, and an additional electrode 5 are arranged in the vacuum chamber 1. The magnetron cathodes 3a and 3b are each equipped with a silicon target. In each case, a pulsed, negative direct current voltage is generated by means of power supply units 4a and 4b. According to the invention, the operation of the power supply units 4a and 4b occurs in two phases. In a first phase, the pulsed, negative direct current voltage is conducted to the magnetron cathode respectively allocated to one power supply unit, wherein the two power supply units 4a, 4b are operated in the push-pull mode. In other words, when the power supply unit 4a conducts a voltage pulse to the magnetron cathode 3a, the power supply unit 4b generates a pulse pause and is simultaneously switched to through-flow. "Switched to through-flow" means that a current flow from the positive pole of the power supply unit 4a to the magnetron cathode 3b is possible. When the power supply unit 4b conducts a voltage pulse to the magnetron cathode 3b, the power supply unit 4a generates a pulse pause and is in turn switched to through-flow.

In a second phase, a pulsed direct current voltage generated by the power supply unit 4a is switched between the magnetron cathode 3a and the additional electrode 5 and a pulsed direct voltage generated by the power supply unit 4b is switched between the magnetron cathode 3b and the additional electrode 5. In the second phase, both power supply units 4a, 4b operate in the common mode. The switch 6 is opened in the first phases and closed in the second phases.

The change for switching the phases occurs at a frequency in the range from 1 Hz to 10 kHz. A magnetron plasma is thus formed in the vacuum chamber 1 in both phases. The magnetron plasma has a higher plasma density in the first phases than in the second phases. Via an inlet not shown in FIG. 1, working gas required for the magnetron sputtering is introduced into the vacuum chamber 1. In the described exemplary embodiment, the working gas argon is used for this purpose. A substrate electrode 7 is arranged on the side of the plate-shaped substrate 2 that is not to be coated, to which an electric voltage with a frequency higher than 1 MHz is applied by means of a power supply unit 8. Due to the bias voltage developing at the substrate electrode 7, ions are accelerated out of the magnetron plasma towards the surface of the substrate 2 to be coated, which leads to a sputter removal on the substrate surface to be coated.

Through an inlet 9, oxygen flows into the vacuum chamber 1 as the reactive gas. The inflow quantity is set by means of an inlet valve 10. The inlet valve 10 is in turn controlled by a known device, not shown in FIG. 1, with a PID controller, which regulates the oxygen inflow into the vacuum chamber 1 such that the silicon targets arranged on the magnetron electrodes 3a and 3b are sputtered in the transition mode.

The switching between the first phase and the second phase according to the invention, the high-frequency electric voltage at the substrate electrode 7, and the regulation of the oxygen inflow into the vacuum chamber 1 such that the magnetron target is sputtered in the transition mode, lead to the silicon oxide layer reactively deposited on the surface of the substrate also compensating for unevenness on the substrate surface and forming a smoothed layer surface.

Silicon-containing and aluminum-containing layers are particularly suitable for the deposition of smoothing layers. In one embodiment of the method according to the invention, therefore, at least one magnetron cathode is equipped with a silicon-containing target and/or at least one magnetron cathode is equipped with an aluminum-containing target.

Figure 2A:
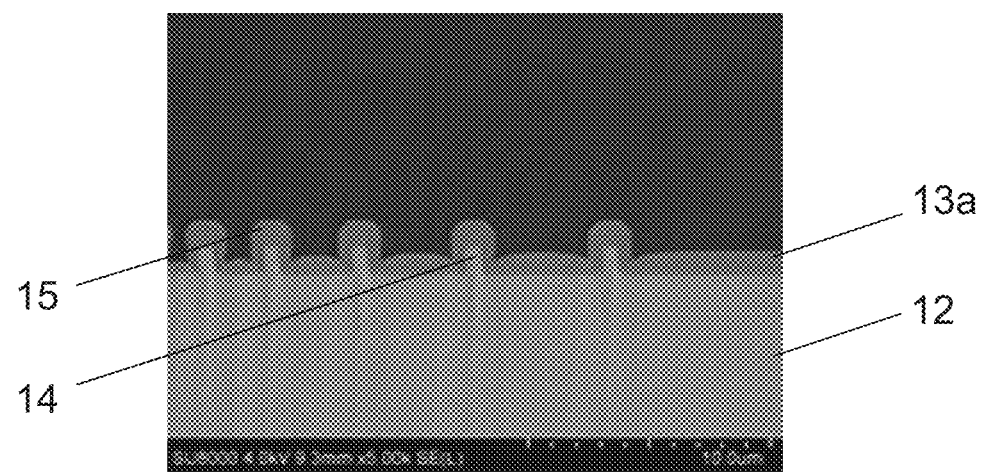
FIG. 2a shows a section through a coated substrate, which was deposited with a silicon oxide layer according to a known method using reactive bipolar magnetron sputtering.
Figure 2B:
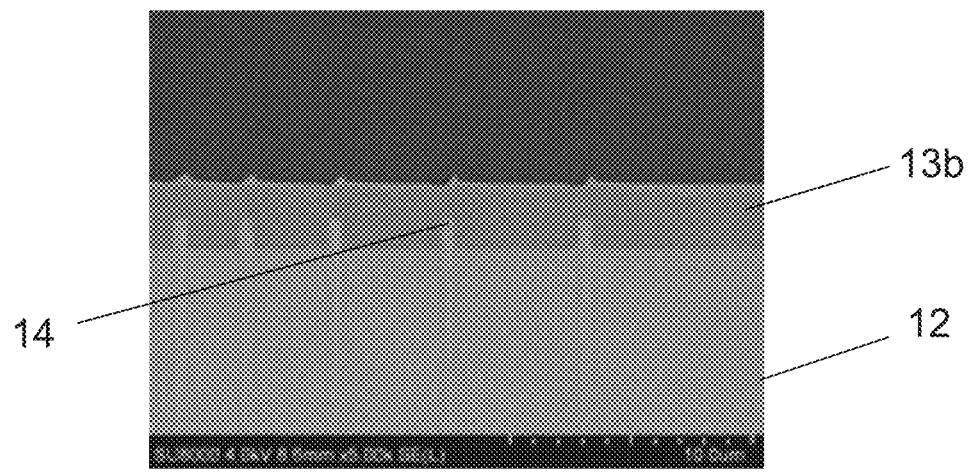
FIG. 2b shows a section through an identical substrate with identical unevennesses, on which a silicon oxide layer was deposited by means of the method according to the invention.

FIG. 2a and FIG. 2b show respective images of a section through a coated substrate taken with a scanning electron microscope (SEM). FIG. 2a shows the section through a substrate 12, which was deposited with a silicon oxide layer 13a according to a known method using reactive bipolar magnetron sputtering. Prior to the coating process, the surface of the substrate was provided with unevennesses 14, which are variously spaced apart from one another. It is discernible from FIG. 2a, that these surface unevennesses also continue in the deposited silicon oxide layer 13a, in which smaller humps 15 were formed. FIG. 2b shows a section through an identical substrate 12 with identical unevennesses 14, on which a silicon oxide layer 13b was deposited by means of the method according to the invention. The silicon oxide layer 13b deposited with the method according to the invention has a significantly smoother surface compared to the silicon oxide layer 13a deposited by means of a known method.

The invention claimed is:

1. A method for depositing a layer on a substrate inside a vacuum chamber by a magnetron sputtering device comprising at least two magnetron cathodes each equipped with a target, at least one additional electrode, wherein a separate power supply unit is allocated to each magnetron cathode, and wherein, in addition to at least one working gas, at least one reactive gas is introduced into the vacuum chamber, the method comprising:
   in a first phase, conducting a pulsed, negative direct current voltage from each power supply unit to the corresponding magnetron cathode, wherein the power supply units are operated in the push-pull mode;
   in a second phase, switching the pulsed direct current voltages provided by the power supply units between the corresponding magnetron cathode and the additional electrode, wherein the power supply units are operated in the common mode or overlapping with regard to pulse sections;
   switching between the first phase and the second phase with a frequency in a range from 1 Hz to 10 kHz;
   forming an electric voltage with a frequency higher than 1 MHz at the substrate or an electrode at the back of the substrate; and
   controlling the introduction of the reactive gas into the vacuum chamber such that the sputtering of the targets occurs in the transition mode.

2. The method according to claim 1, wherein time periods of the first phases are set overall to a ratio from 5% to 60%.

3. The method according to claim 1, wherein time periods of the first phases are set overall to a ratio from 10% to 35%.

4. The method according to claim 1, wherein for the forming of the electric voltage with the frequency higher than 1 MHz, electric power is used amounting to 5 to 50% of the electric power for the sputtering of all targets.

5. The method according to claim 4, wherein for the forming of the electric voltage with the frequency higher than 1 MHz, electric power is used amounting to 10 to 35% of the electric power for the sputtering of all targets.

6. The method according to claim 1, wherein at least one silicon-containing target is used.

7. The method according to claim 1, wherein at least one aluminum-containing target is used.

8. The method according to claim 1, wherein an at least oxygen-containing reactive gas is introduced into the vacuum chamber.

9. The method according to claim 8, wherein a mixture of oxygen and nitrogen or a mixture of oxygen and a gas comprising a fluorine compound is introduced into the vacuum chamber as the reaction gas.

10. The method according to claim 1, wherein the pressure inside the vacuum chamber is set to a value of less than 0.5 Pa.

* * * * *